United States Patent [19]
O'Brien

[11] Patent Number: 5,977,474
[45] Date of Patent: Nov. 2, 1999

[54] CONTINUOUSLY VARIABLE CIRCUIT FOR PRODUCING AN OUTPUT SIGNAL HAVING A CONTINUOUSLY VARIABLE AMOUNT OF CLEAN AND DISTORTED SIGNALS

[76] Inventor: Timothy O'Brien, 3908 Woodruff Rd., Columbus, Ga. 31904

[21] Appl. No.: 09/005,336

[22] Filed: Jan. 9, 1998

Related U.S. Application Data

[63] Continuation of application No. PCT/US96/11417, Jul. 8, 1996
[60] Provisional application No. 60/001,078, Jul. 12, 1995.
[51] Int. Cl.⁶ .......................... G10H 1/055; G10H 1/08; G10H 1/46; G10H 3/18
[52] U.S. Cl. .................... 84/735; 84/737; 84/741; 84/746; 84/DIG. 26
[58] Field of Search ............................ 84/701–711, 721, 84/723–742, 746, DIG. 4, DIG. 26

[56] References Cited

U.S. PATENT DOCUMENTS

| | | |
|---|---|---|
| 3,812,278 | 5/1974 | Aker ........................................... 84/705 |
| 3,973,461 | 8/1976 | Jahns ......................................... 84/701 |
| 4,399,326 | 8/1983 | Bode . |
| 4,405,832 | 9/1983 | Sondermeyer . |
| 4,495,640 | 1/1985 | Frey . |
| 4,627,094 | 12/1986 | Scholz . |
| 4,649,785 | 3/1987 | Chapman . |
| 4,672,671 | 6/1987 | Kennedy . |
| 4,752,960 | 6/1988 | Scholz . |
| 4,809,336 | 2/1989 | Pritchard . |
| 4,811,401 | 3/1989 | Brown, Sr. et al. . |
| 4,890,331 | 12/1989 | Brown, Sr. et al. . |
| 4,987,381 | 1/1991 | Butler . |
| 5,022,305 | 6/1991 | Butler ..................................... 84/746 X |
| 5,032,796 | 7/1991 | Tiers et al. . |
| 5,133,014 | 7/1992 | Pritchard . |
| 5,498,996 | 3/1996 | Frankland . |

*Primary Examiner*—Stanley J. Witkowski
*Attorney, Agent, or Firm*—Knobbe, Martens, Olson & Bear, LLP

[57] ABSTRACT

An amplifier circuit for providing a combined clean and dirty output signal from an electric guitar. The circuit comprises a panning pedal that has two potentiometers attached thereto so that movement of the panning pedal results in two continuously varying ranges of resistances being produced by the potentiometers. The output signal of the guitar is provided to the panning pedal and the resistance values of the potentiometers determine the proportion of the guitar output signal that is to be provided to a clean pre-amp stage and the proportion that is to be provided to a dirty pre-amp stage. The clean pre-amp stage amplifies the output signal substantially without distortion and the dirty pre-amp stage amplifies the signal so as to produce a saturated output signal. The output of the clean pre-amp stage and the dirty pre-amp stage are then combined to produce a single output signal. By changing the position of the panning pedal, the proportion between the dirty and clean signals in the single output signal can be continuously varied of a range of proportions.

18 Claims, 6 Drawing Sheets

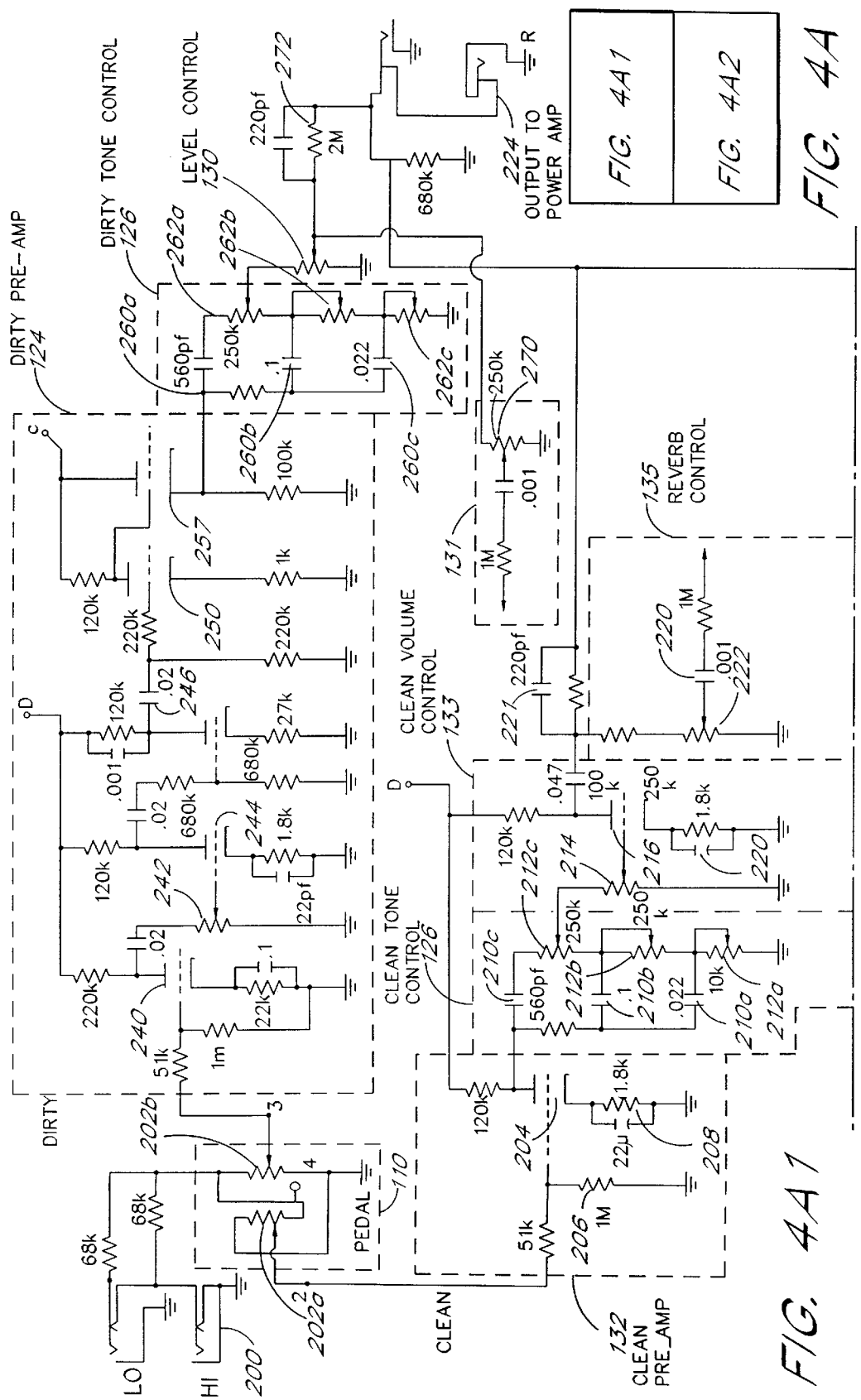

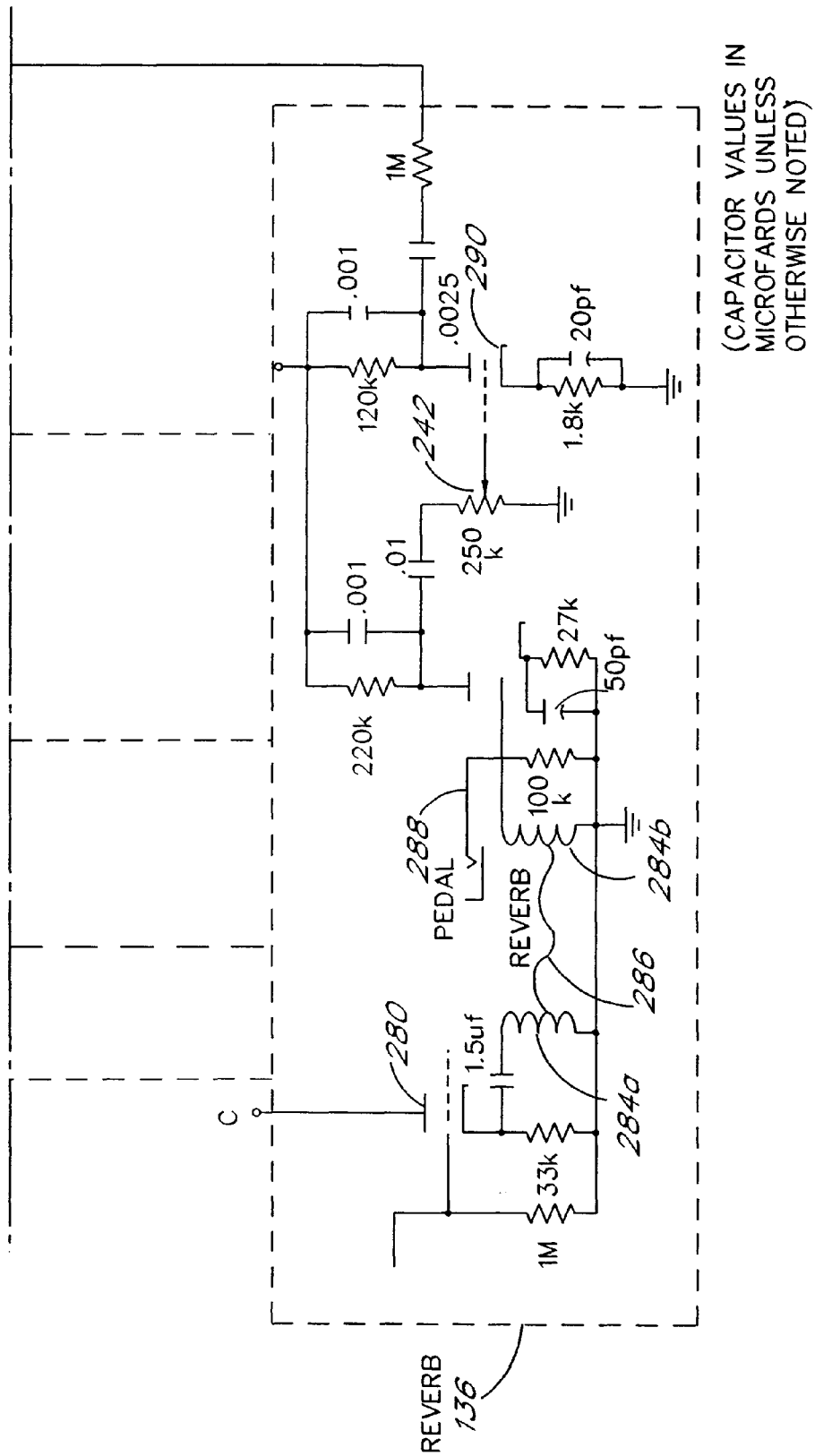
FIG. 4A2

CONTINUOUSLY VARIABLE CIRCUIT FOR PRODUCING AN OUTPUT SIGNAL HAVING A CONTINUOUSLY VARIABLE AMOUNT OF CLEAN AND DISTORTED SIGNALS

RELATED APPLICATIONS

This application is a continuation of International Application PCTUS96/11417, filed Jul. 8, 1996, designating the United States which claims priority under Title 35, USC §119(e) to U.S. Provisional Application No. 60/001,078, filed Jul. 12, 1995.

BACKGROUND OF THE INVENTION

1. Field of the Invention

The present invention relates to an amplifier used in conjunction with musical instruments such as electric guitars and in particular concerns a circuit for continuously varying the proportion of an input signal fed into a clean channel and into a distorted channel to provide a single combined output signal having varying proportions of clean and dirty amplification.

2. Description of the Related Art

Electric guitars are very popular musical instruments and are capable of producing a wide range of different sounds. In particular, electric guitars can, when used in conjunction with an amplifier, be used to produce a clear sound that is highly reflective of the sound of the strings or the amplifier can be biased so that the sound coming from the amplifier as a result of playing the guitar is distorted. Generally, a distorted sound from an electric guitar results from the amplifier being driven into saturation.

Musicians like to be able to selectively produce either the clean or the distorted sound. Some existing amplifiers have several channels wherein the musician can set a predetermined level of distortion that will be produced by the amplifier in response to the musician playing the instrument. For example, the player may set a channel where a quarter of the sound signal produced is distorted and three quarters is clear. Hence, while playing the musical instrument, the player can select between discreet channels and discreet levels of distortion. In this way, the musician is able to vary the sound produced by the electric guitar.

However, one shortcoming of the prior art electric guitar and amplifier systems is that the changes in the level of distortion are very abrupt. Further, with most existing amplifiers, the number of channels that can be preprogrammed with a proportionate amount of clear and distorted signals is limited, which means that the musician is limited in his or her ability to produce a variety of sounds. Even with the high end amplifiers that have a tremendous number of different channels, there is still an abruptness to transitions between channels.

Hence, there is a need for an amplifier circuit that can be used to continuously switch between different sound characteristics. In particular, with electric guitars, there is a need for an amplifier system that allows the musician to vary the proportion of clean tones and distorted tones emanating from the amplifier while playing the electric guitar over a continuous range.

SUMMARY OF THE INVENTION

The continuously variable amplifier of the present invention comprises a device, that receives the signals from the outputs of the electric guitar, and two separate pre-amp circuits. The device sends a portion of the input signal received from the musical instrument to the first pre-amp circuit and a portion to the second pre-amp circuit depending upon the position of the device.

In the preferred embodiment, the device is comprised of two opposing potentiometers positioned underneath a panning pedal so that movement of the pedal results in a proportionate increase and decrease in the signal produced by two potentiometers. In this way, the position of the pedal controls the portion of the input signal that is sent to the first and second pre-amp circuits. Further, in the preferred embodiment, the first pre-amp circuit is comprised of an amplifier circuit that saturates the incoming signal and thereby produces a distorted or "dirty" signal and the second pre-amp circuit is comprised of an amplifier circuit that amplifies the signal from the musical instrument without distortion to thereby produce a "clean" signal.

In the preferred embodiment, the dirty pre-amp circuit and the clean pre-amp circuit include tone control sections. Hence, the signals in each of the circuits are also tonally modified based on user-selected tone inputs. Further, a portion of the signals in each of these circuits can then be sent to a reverb stage that provides a preselected amount of reverb sound quality to the final output sound. The combined output signal comprised of the signal from the dirty pre-amp circuit, the clean pre-amp circuit and the reverb circuit is then combined and sent to a power amp which amplifies the sound to the signal for a speaker to use.

One advantage of the amplifier circuit of the preferred embodiment is that the user, using the panning pedal, is capable of continuously varying the proportion of the signal that is sent from the musical instrument to two separate preamplifier stages. This allows for significant flexibility for the musician to create a wide range of different sounds while playing the musical instrument. Further, because the panning pedal is continuously variable, and because, in the preferred embodiment, analog electronic devices, such as potentiometers, are used to vary the proportion of the incoming signal that is sent between the two amplifier circuits, the changes in the portion of the sound signal that is dirty or clean are perceived by the listener as continuous. Hence, using the amplifier of the preferred embodiment results in the listener not being subjected to abrupt changes in the proportion of discreet characteristics of a particular sound signal produced by a musical instrument.

These and other objects and advantages of the present invention will become more fully apparent from the following description taken in conjunction with the accompanying drawings.

BRIEF DESCRIPTION OF THE DRAWINGS

FIGS. 4A1, 4A2 and 4B are circuit diagrams illustrating the circuit implementation of the amplifier shown in FIG. 3.

DETAILED DESCRIPTION OF THE PREFERRED EMBODIMENT

Figure 1:
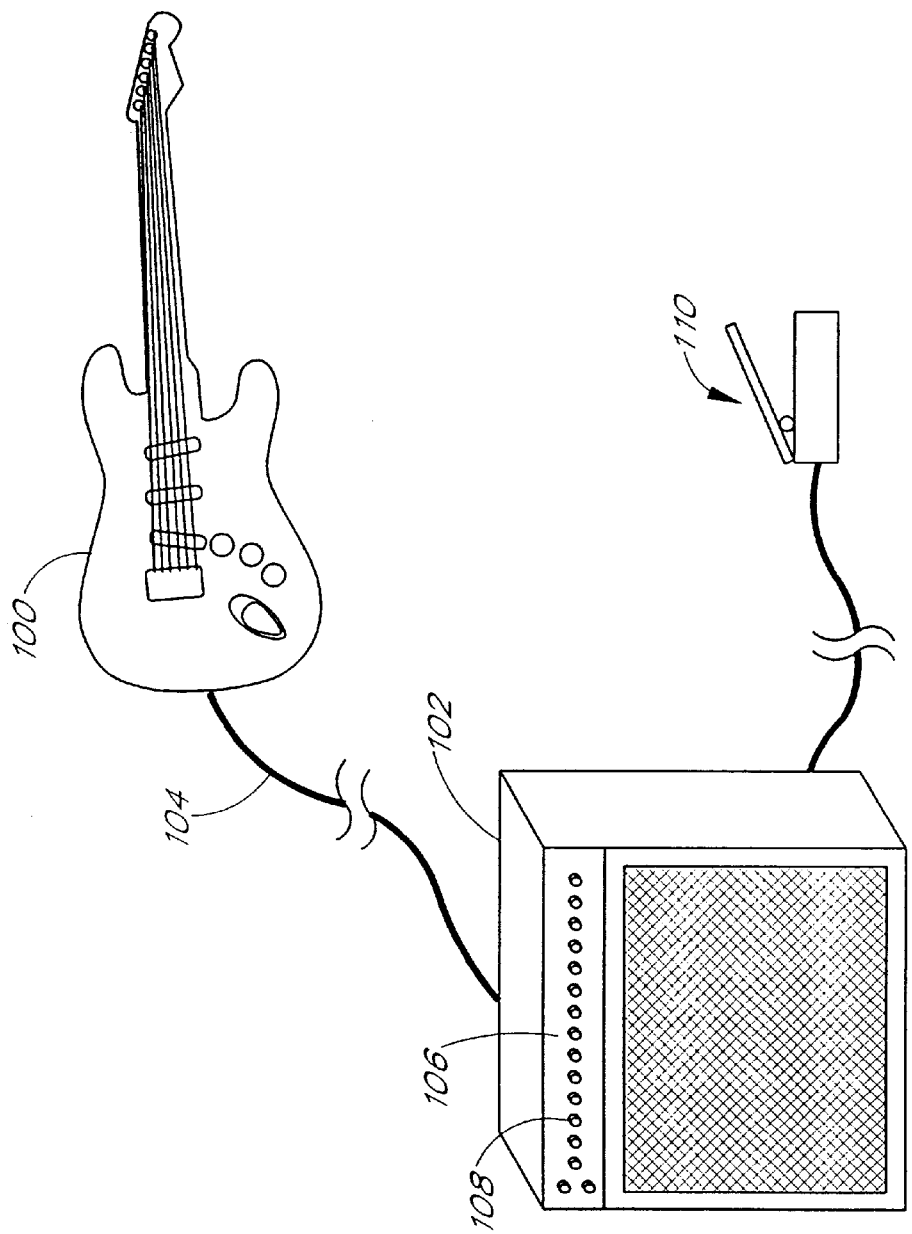
FIG. 1 is a perspective view of an electric guitar used in conjunction with an amplifier system of the preferred embodiment.

Reference will now be made to the drawings wherein like numerals refer to like parts throughout. FIG. 1 is a perspective view of an electric guitar 100 that is providing an electric signal, representative of the musical notes played by a musician, to an amplifier 102 via a cord 104. The electric guitar 100, in this embodiment, is substantially similar to electric guitars of the prior art. The amplifier 102 includes a control panel 106 that has a plurality of control buttons 108.

FIG. 1 also illustrates a panning pedal 110 which will continuously vary the signal produced by the amplifier 102 between a "clean" non-distorted signal and a "dirty" distorted signal. In other words, the sound signal produced by a speaker (not shown) attached to the amplifier 102 has a proportionate amount of a clean sound and a proportionate amount of a dirty sound depending upon the position of the panning pedal 110. The operation of the amplifier 102 to achieve this mix of clean and dirty sound signals will be described in greater detail hereinbelow.

Figure 2:
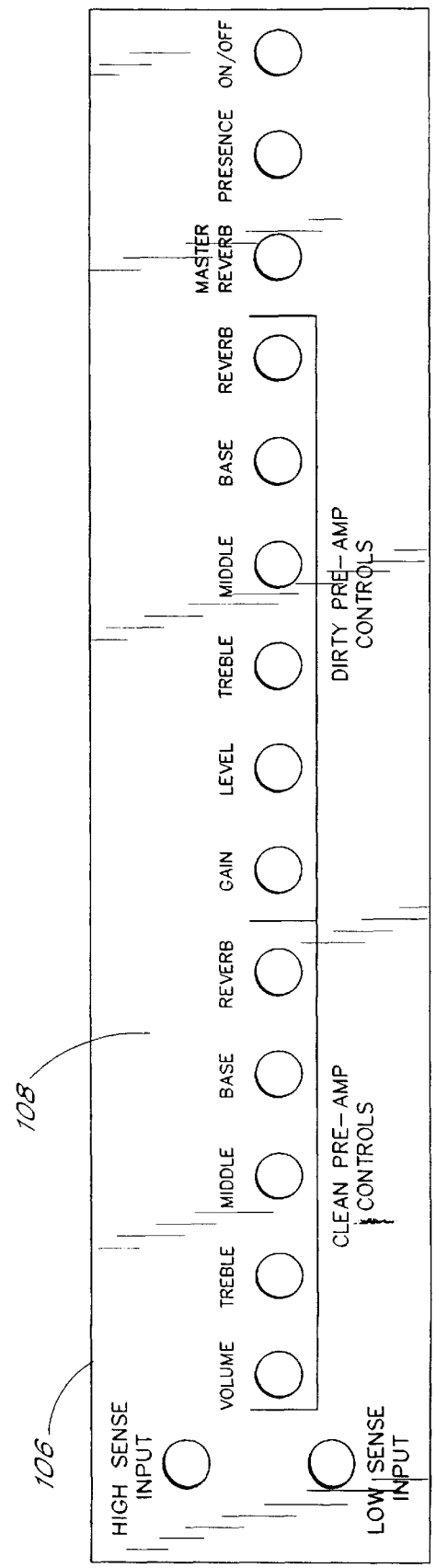
FIG. 2 is a front view of one embodiment of a front panel of the amplifier of FIG. 1 illustrating the controls.

FIG. 2 illustrates the control panel 106 of the amplifier 102 in greater detail. As shown in FIG. 2, there are a plurality of controls 108a that are adjustable by the musician that control the operation of the amplifier 102. Going from left to right, there are two inputs, a high sense input and a low sense input, that the user uses in the same manner for the same purposes that these inputs are used in the prior art. There are also a plurality of clean preamplifier controls that the user can adjust to adjust the performance of a clean preamplifier (pre-amp) circuit 122 (FIG. 3) of the amplifier 102. Specifically, there is a volume knob which the user can adjust to adjust the gain of the clean preamplifier circuit. There are also treble, middle and bass controls that the musician can adjust to effect the tone of the signal coming out of the clean preamplifier circuit and then there is also a reverb control which controls the proportion of the clean preamplifier signal that is to be sent to a reverb amplifier circuit of the amplifier 102.

Figure 3:
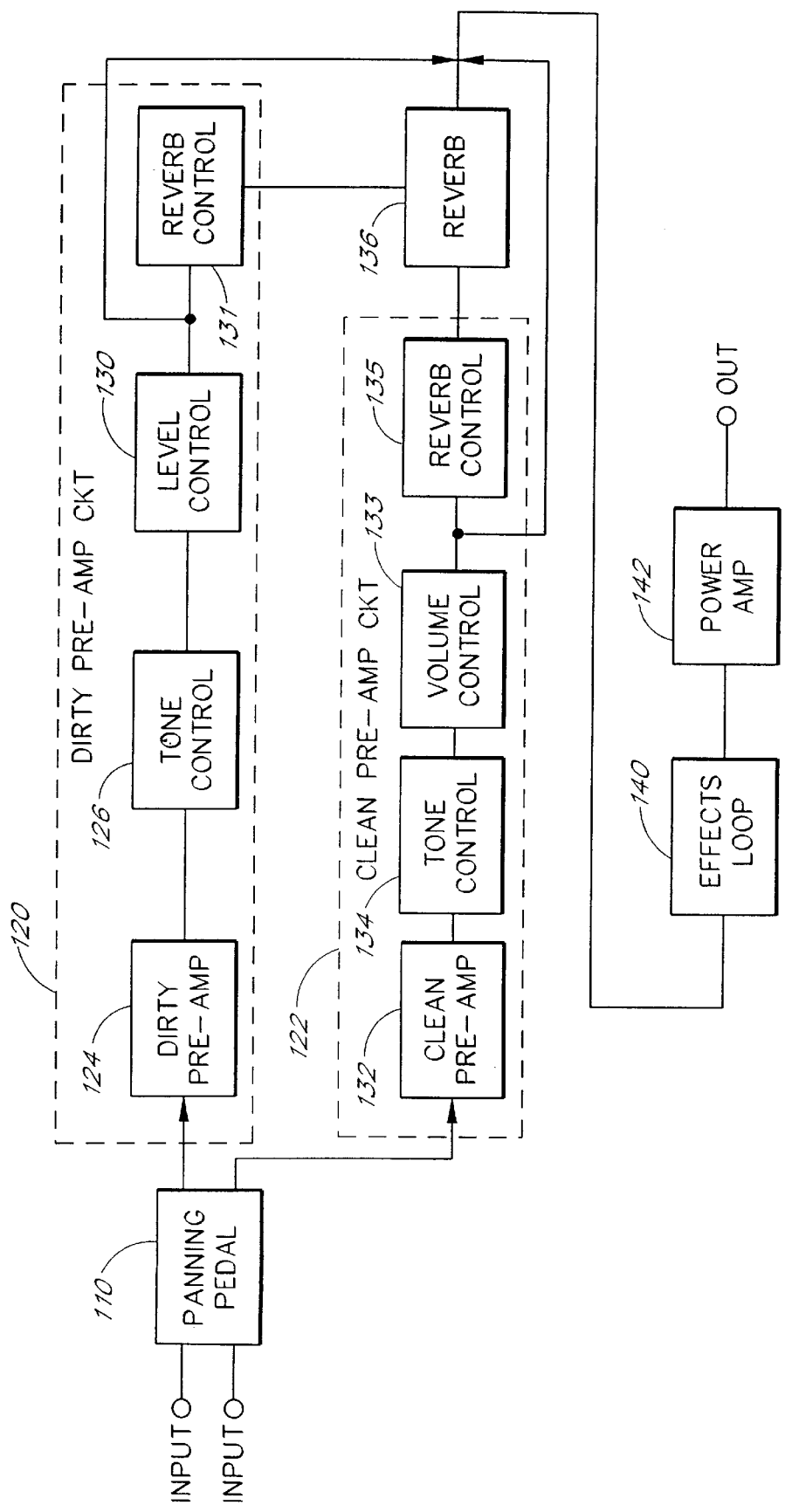
FIG. 3 is a block diagram illustrating the stages of the amplifier circuit of FIG. 1.

Similarly, there is also a plurality of controls 108b that the user can adjust to control the operation of a dirty preamplifier (pre-amp) circuit 120 (FIG. 3). Specifically, from left to right, there is a gain control which determines the amount of gain of the dirty amplifier circuit. There is also a level adjust which the musician can use to set the maximum level of the saturation of the dirty pre-amp circuit, e.g., set the maximum amplitude of the resulting signal. Additionally, there is a treble, middle, and bass tone control knob that the user can adjust to adjust the tone values of the signal produced by the dirty pre-amp circuit. Finally, there is also a reverb control that the musician can use to determine the proportion of the sound signal produced by the dirty pre-amp circuit that is going to be sent to a reverb amplifier stage.

Further, on the control panel 106, there are also a master reverb control 108c located to the right of the dirty pre-amp controls that controls the overall amplitude of the reverb circuit produced that is to be produced by the amplifier 102, a presence control 108d which determines the amount of presence characteristics that is to be imparted to the signal produced by the amplifier 102 and an on-off switch 108e. With the aforementioned controls, the musician can preset the characteristics of the signal that is to be produced by the clean pre-amp circuit and also the characteristics of the signal that is to be produced by the dirty pre-amp circuit in the amplifier 102. Once these controls have been set, the musician can then play the musical instrument and dynamically vary the amount of signal produced by the musical instrument 100 that is sent to the clean pre-amp circuit and to the dirty pre-amp circuit by manipulation of the foot pedal 110 (FIG. 1) in the manner that will be described in greater detail hereinbelow.

It will be understood that additional controls, such as an on-off switch, a stand-by switch, and a polarity three-way switch, can be provided for the amplifier 102 of the preferred embodiment. Further, additional amplifier inputs and outputs may also be provided to produce such things as effect loops and the like. It will further be understood, that the exact arrangement of the controls on the amplifier can vary without departing from the scope of the present invention.

FIG. 3 is a block diagram which illustrates the functional organization of the amplifier 102 of the present invention. Specifically, the input signal from the musical instrument 100 is fed into the panning pedal 110. Further, the panning pedal 110 also receives a mechanical input reflective of the extent to which the musician has depressed the pedal 110. Based upon the musician's depression of the pedal 110, a portion of the input signal received from the musical instrument 100 is sent to a dirty pre-amp circuit 120 or to a clean pre-amp circuit 122.

The signal sent to the dirty pre-amp circuit 120 is initially sent to a dirty preamp stage 124 which amplifies the signal received from the guitar based upon the setting of the dirty pre-amp gain control knob on the control panel 106 (FIG. 2). Preferably, the dirty pre-amp stage 124 includes one or more amplifier devices that are driven into saturation to produce the dirty amplified signal. The dirty amplified signal is then sent to a tone control stage 126 which adjusts the treble, middle and bass tones of the amplified dirty signal based upon the settings of the treble, middle and bass dirty pre-amp controls on the control panel 106. The amplified and tonally adjusted signal is then sent to a level control stage 130 which decreases the volume, or gain, of the signal going to a power amplifier 142. The musician can set the level of the dirty signal going to the power amp by adjusting the level control on the control panel 106 (FIG. 2).

A portion of the amplified and tonally adjusted signal produced by the dirty pre-amp circuit 120 is then sent to a reverb circuit 136 depending upon the settings of a reverb control circuit 131. The reverb control circuit 131 is controlled by the settings of the dirty pre-amp reverb control knob on the control panel 106 (FIG. 2).

Turning now to the clean pre-amp circuit 122, the portion of the input signal from the musical instrument 100 that is sent to the clean pre-amp circuit 122, in accordance with the panning pedal 110, is initially amplified in a clean pre-amp stage 132. The clean pre-amp stage 132 amplifies the signal and the amplified signal is then sent to a tone control stage 134 which adjusts the treble, middle and bass tones of the clean amplified signal. The tonally adjusted signal is then sent to a volume adjust stage 133 which adjusts the gain of the signal produced by the clean pre-amp stage 132 based upon the settings of the volume control knob on the clean pre-amp section of the control panel 106 (FIG. 2). The signal is then sent to a reverb control stage 135 that sends a portion of the tonally adjusted clean signal to the reverb circuit 136.

Subsequently, the clean tonally adjusted signal, the dirty tonally and level adjusted signal and the signal from the reverb circuit are then combined and sent into an optional effects loop 140. The effects loop 140 can be used to alter a particular characteristic of the combined signal coming out of the dirty and clean pre-amp stages and the reverb circuit 136. Subsequently, the signal is then sent to a power amp where the signal is amplified and then sent to a speaker (not shown).

Hence, the amplifier 102 of the present invention determines the proportion of the signal that is being produced by the musical instrument 100 that is going to be sent to either a dirty or a clean pre-amp circuit by the position of the panning pedal 110. The proportion that is sent to either stage is then adjusted in accordance with the settings of the controls 108 on the control panel 106 (FIG. 2) and a portion of each signal can also be sent to a reverb circuit. Subsequently, the distorted or dirty signal is then combined with the clean signal to produce a single output signal. Hence, the circuit of the preferred embodiment allows the musician to set the initial characteristics of the signal that the musician desires and then dynamically adjust the clean and dirty portions of the signal that is to be produced by the amplifier over a continuous range from 100% clean to 100% distorted or dirty by simply moving the panning pedal 110 to a desired position.

FIG. 4 is an electrical schematic which further illustrates one preferred implementation of the circuit shown in FIG. 3. The input signal from the guitar is initially sent to a hi-low input section 200. The hi-low input section 200 is typical of hi-low input section 200 of the prior art in that the musician can select whether high gain or low gain is desired. The input signal is then sent to the panning pedal 110. The panning pedal 110 includes two potentiometers 202*a* and 202*b* wherein the position of these two potentiometers 202*a* and 202*b* result in a proportion of the input signal being provided to the clean pre-amp stage 122 and the dirty pre-amp stage 120. In particular, the two potentiometers 202*a* and 202*b* are inverted with respect to each other so that depression of the panning pedal 110 by the musician results in an increase of resistance by one of the potentiometers and a corresponding decrease by the other. The panning pedal 110 is preferably pivotable about a center point so as to be depressible in two different directions. In this manner a proportion of the input signal being provided to each of the two pre-amp circuits 122, 124 can be continuously varied and the input signal is divided into a first clean signal and a second dirty signal wherein the proportion between the two signals depends upon the position of the panning pedal 110.

The clean signal is initially sent to the clean pre-amp stage 132 which, in this embodiment, is comprised of a single vacuum tube amplifier circuit 202. In particular, the clean signal is provided to the grid of the vacuum tube 204 through a resistive network 206. The cathode of the vacuum tube 204 is connected to a resistor in parallel with a capacitor 208. The output signal is provided on the plate of the vacuum tube 204 and is thus phase shifted 180°.

The output signal of the plate of the tube 204 is then sent to the clean tone control stage 126 which is essentially comprised of three separate capacitors and potentiometers coupled together. In particular, the clean tone control 126 is comprised of a three capacitors 210*a*–210*c* in series with three potentiometers 212*a*–212*c* which correspond to the treble, middle and bass controls clean pre-amp control knobs 108*a* on the control panel shown in FIG. 2 that are positioned in parallel. The capacitors 210*a*–210*c* are selected to pass selected frequencies of signals and the proportion of those signals that are combined into a tone output signals depends upon the settings of the potentiometers 212*a*–212*c*. Consequently, the amplified signal from the clean pre-amp stage 132 is then tonally adjusted depending upon the settings of the potentiometers 212*a*–212*c*. The musician can therefore select tone characteristic of the clean portion of the output signal independent of the tone characteristics of the dirty or distorted signal.

The output signal of the clean tone control stage 126 is then sent to the clean volume control 135 which is essentially comprised of a potentiometer 214 that feeds the grid of a tube amplifier. The potentiometer 214 corresponds to the clean volume control knob of the clean pre-amp circuit controls 108*a* on the control panel 106 shown on FIG. 2. Hence, the musician can adjust the volume of the tonally adjusted clean portion of the output signal independent of the volume of the dirty signal.

The output of the tube amplifier 216 in the clean volume control stage 133 is taken from the plate of the tube 216 and is thereby phase shifted an additional 180°. Hence, the output of the clean pre-amp circuit 120 (FIG. 2) is in phase with the input which enhances the sound quality of the clean portion of the output signal produced by the amplifier 100.

The clean output signal is then sampled by the reverb control stage 135 which is essentially comprised of a resistive and capacitance network that includes a potentiometer 222 that corresponds to the clean reverb knob in the clean pre-amp controls 108*a* of the control panel 106 shown in FIG. 2. The musician can then select the portion of the clean signal that is to be sent to the reverb circuit 136 independently of the dirty output signal. The operation of the reverb circuit 136 will be described in greater detail hereinbelow. The remaining portion of the clean output signal is then provided to the power amp (FIG. 4B) via a parasitic suppression circuit 221 and a pre-amp send/return jack 224.

Similarly, the dirty portion of the input signal from the potentiometers 202*a* and 202*b* of the panning pedal 110 is directed into the dirty pre-amp stage 124. The dirty pre-amp stage 124 includes a first tube amplifier 240 that amplifies the dirty signal provided by from the pedal 110. As discussed above, the dirty pre-amp stage 124 amplifies the dirty input signal until the output signal is driven into saturation which produces the distorted or dirty signal. Hence, the dirty pre-amp stage includes several tube amplifiers that amplify the signal in stages so that the signal output from the pre-amp stage 124 is the desired saturated signal. Thus, the output signal of the first tube amplifier 240 is taken from the plate of the amplifier 240 and is provided via a potentiometer 242 to the grid of a second tube amplifier 244. The potentiometer 242 corresponds to the gain control of the dirty pre-amp controls 108*b* which controls the amount of signal provided to the grid of a second tube amplifier 244. Consequently, the musician can, independent of the clean signal, adjust a gain characteristic of the dirty portion of the output signal. In particular, the musician, can set the gain control so that very low amplitude input signals are distorted or can set the gain control so that it requires very high amplitude input signals to produce a distorted output signal.

The clean signal is then provided to the second tube amplifier 244 wherein the signal is further amplified. At this point, the signal is beginning to saturate and exhibit the desired dirty or distorted characteristics. The signal from the plate of the second tube amplifier 244 is then provided to the grid of a third tube amplifier 246 via voltage divider network 248. The voltage divider network ensures that the signal that the amplified signal is symmetrical. Subsequently, the third tube amplifier 246 further amplifies the signal which may result in the third tube amplifier 246 being driven into saturation and clipping the output signal provided on the plate of the third tube amplifier 246 thereby producing the distorted or "dirty" output signal. Specifically, the peaks of the waveform are being clipped and the signal includes harmonics.

The output signal of the third tube amplifier 246 is provided via a resistive network 250 to a fourth tube amplifier 252 that further amplifies the output signal to ensure that the signal is entirely distorted. The output signal of the fourth tube amplifier 252 is provided at the plate of the fourth tube amplifier 252 and is provided to a fifth tube amplifier 254 that provides the output signal on its cathode.

The cathode follower configuration of the fourth tube amplifier 252 provides a low impedance output signal. Further, as discussed above, the tube amplifiers provide a 180° phase change to the signal when the output is taken at the plate. However, the tube amplifiers do not provide an phase change when the output is taken on the cathode. Hence, the output signal from the dirty pre-amp stage 124 has the same phase as the input signal, which enhances the quality of the sound produced and also has the same phase as the output of the clean pre-amp circuit after the clean volume control stage 133. Consequently, the dirty and clean proportion of the output signal have the same phase which eliminates the problem of the dirty and clean signals canceling each other.

The dirty output signal is then provided to the dirty tone control stage 126 which is substantially similar in configuration as the clean tone control stage 134. Specifically, the dirty tone control includes three capacitors 260a–260c in series with three potentiometers 262a–262c wherein the capacitors are configured to pass certain frequencies of signals. The potentiometers 262a–262c correspond to the treble, middle and bass controls of the dirty pre-amp controls 108b on the control panel 106 shown in FIG. 2. Hence, the musician can set the tonal characteristics of the dirty portion of an output signal independent of the tone characteristics of the clean portion of the output signal.

Figure 4B:
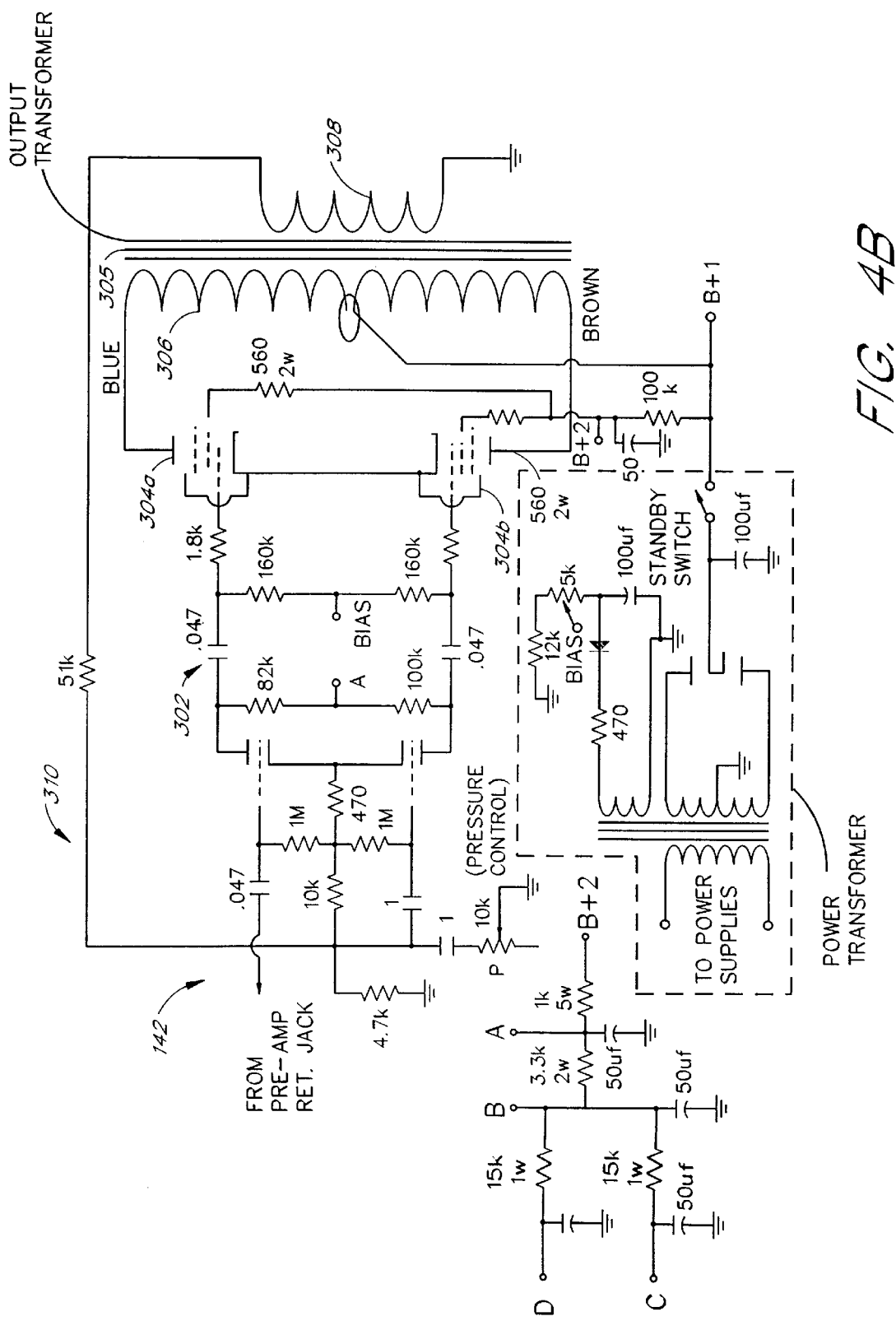

Subsequently, the amplified and tonally adjusted signal is then sent through the level control 130 which is essentially comprised of a potentiometer that corresponds to the dirty level control of the dirty controls 108b on the control panel 106 shown in FIG. 2. The level control allows the musician to set the volume of the dirty signal independent of the clean signal. Hence, the characteristics of both the clean signal and the dirty signal can be independently modified by the musician. The dirty portion is sent through a parasitic suppression circuit 273 and is combined with the clean portion of the output signal at the send/return jack 224 and then sent to the power amplifier (FIG. 4B). Consequently, the panning pedal 110 divides an input signal and sends it to two separate pre-amp stages in proportion to the mechanical signal provided by the musician depressing the foot pedal. These divided signals are then independently amplified and modified and then recombined into a single output signal.

As discussed above, the amplifier of the preferred embodiment includes a reverb circuit 136 that introduces a reverb characteristic onto both the clean and the distorted signal prior to these signals being combined. Consequently, the dirty preamp circuit 120 includes a dirty reverb control circuit 131 that samples the output of the dirty tone control stage 126. The dirty reverb control 131 is comprised of a potentiometer 270 that corresponds to the dirty reverb control of the dirty pre-amp controls 108b on the control panel 106 shown in FIG. 2. Hence, the musician can set, independent of the settings of the portion of the clean signal that is being provided to the reverb circuit, the control to send a portion of the dirty signal to the reverb circuit 136.

The portion of the clean signal and the dirty signal are then simultaneously provided to the grid of a tube amplifier 280 at point 1. The output of the tube amplifier 280 is taken at the cathode and is fed to an inductive ring mechanism 282. The inductive ring mechanism 282 is comprised of two inductors 284a and 284b and a spring 286 interposed therebetween. The signal provided via the cathode follower to the inductor 284a induces a mechanical deflection of the spring 286 which results in a ringing characteristic being imparted to the signal emanating from the inductor 284b. The output of the inductive ring mechanism is then fed into the grid of a first tube amplifier 288 and the output of plate of the amplifier 288 is then fed into the grid of a second tube amplifier 290 via a potentiometer 292. The potentiometer 292 corresponds to the master reverb level control 108c on the control panel 106 shown in FIG. 2. The control 108c allows the musician to set the level or gain of the reverb signal that is comprised of both the portion of the clean and dirty signal that was sent to the reverb circuit 136. The output at the plate of the tube amplifier 290 is then combined with the dirty and clean signals at the return jack 242. It will be appreciated that the phase of the reverb output signal is the same as the phase of the dirty and clean output signals so that the combined signals are all substantially in phase.

FIG. 4B illustrates the power amplifier 142 in greater detail. In particular, the signal from the pre-amp return jack 242 is sent into a phase inverter driver 302 which splits the signals 180° out of phase and then sends the signals via two beam tetrodes 304a and 304b onto a primary winding 306 of the output transformer 305. It will be appreciated that pentodes can be substituted for beam tetrodes. The phase inverter network 302 is adjustable to balance the phases to provide the most optimum output and there is a negative feedback loop 310 which feeds back from a secondary winding of the transformer to the input to the phase inverter driver 302 to lower the overall distortion at the cost of a lower gain. The secondary windings 308 provide an output signal to a speaker (not shown). Hence the power amplifier simply adjusts the combined dirty/clean output signal into a configuration that can drive an audio speaker to produce the desired audio sound.

FIG. 4B also illustrates that the power amplifier 142 also includes a power transformer 320 that provides power via a decoupling network 322 to power the preamplifier circuits described in reference to FIG. 4A. Further, there is preferably a biasing potentiometer 324 that can be used to adjust the level of bias going to the output tubes in the phase inverter 302. The circuits shown in FIGS. 4A and 4B are simply illustrative of one preferred circuit for implementing the function described herein. It will be appreciated that the component values and the circuit configuration can vary and still achieve the desired function.

Hence, from the foregoing, the amplifier 102 of the preferred embodiment can provide an output signal that has a continuously variable proportion of a clean amplified signal and a distorted or dirty amplified signal wherein the tone and gain characteristics of the clean and dirty signals are independently adjustable. Further a portion of both the clean and the dirty signals can be sent to a reverb circuit to provide a reverb characteristic to the output signal. Additional signals can also be added to the combined signal using devices such as an effects loop. Consequently, the amplifier of the preferred embodiment provides for a manner of providing an output signal that has continuously variable proportions of clean and distorted signals and can thereby allow for smooth transitions between levels of clean and distorted or dirty signal.

The circuit arrangement of the amplifier 102 described herein above and the component values of the devices used to implement the circuit, are shown in FIGS. 4A and 4B in sufficient detail so as to allow a skilled designer to implement this circuit. It will be understood that various changes in the actual implementation of this circuit can be made without departing from the spirit of this invention. Consequently, although the preferred embodiment of the present invention has shown, described and pointed out the fundamental novel features of the invention as applied to these embodiments, it will be understood that various omissions, substitutions, and changes in the form of the detail of the device illustrated, may be made by those skilled in the art without departing from the spirit of the present invention. Consequently, the scope of the invention should not be limited to the foregoing discussion, but is to be defined by the claims which follow.

What is claimed is:

1. An amplifier circuit receiving an input signal from a musical instrument for producing an output signal that includes both an undistorted amplified signal and a distorted amplified signal wherein said amplifier circuit comprises:
   a variable dividing network that receives said input signal from said musical instrument and a mechanical input from a musician wherein said dividing network transforms said input signal into a first signal and a second signal and wherein said variable dividing network is continuously variable in response to said mechanical input so that the proportion of said first signal and said second signal are continuously variable;
   a first pre-amp stage that receives said first signal from said variable dividing network and amplifies said first signal so that a substantially undistorted first signal is produced; and
   a second pre-amp stage that receives said second signal from said variable dividing network and amplifies said second signal so that a second distorted signal is produced wherein said second distorted signal is a saturated output signal occurring as a result of said second pre-amp stage being driven into saturation and wherein said first undistorted signal and said second distorted signal are combined into a single output signal.

2. The amplifier of claim 1, wherein said variable dividing network is comprised of a panning pedal that has two inverted potentiometers attached thereto so that when said panning pedal is depressed by said musician, said potentiometers change resistance and wherein said potentiometers divide said input signal into said first and said second signals in proportion to the respective resistances of said two inverted potentiometers.

3. The amplifier of claim 2, wherein said first pre-amp stage is comprised of a single tube amplifier that amplifies said first signal to said first substantially undistorted first signal.

4. The amplifier of claim 3, wherein said second pre-amp stage is comprised of a plurality of tube amplifiers that amplify said second signal so that said second signal is said saturated output signal.

5. The amplifier of claim 4, further comprising:
   a first tone control stage receiving said first undistorted signal and having one or more musician inputs wherein said musician can adjust the tone characteristics of said first undistorted signal independently of said tone characteristics of said second distorted signal; and
   a second tone control stage receiving said second distorted signal and having one or more musician inputs wherein said musician can adjust the tone characteristics of said second distorted signal independently of said tone characteristics of said first undistorted signal.

6. The amplifier of claim 5, further comprising:
   a first volume control receiving said first undistorted signal and one or more musician input signals which adjusts the amplitude of the first undistorted signal independent of the volume of said second distorted signal; and
   a second level control receiving said second distorted signal and one or more musician input signals which adjusts the amplitude of the second distorted signal independent of the amplitude of said first undistorted signal.

7. The amplifier of claim 6, wherein said first and second signals, said first undistorted signal and said second distorted signal are all in phase.

8. The amplifier of claim 1, further comprising:
   a reverb circuit that receives combined signal comprised of a portion of said first undistorted signal and a portion of said second distorted signal and produces a reverb characteristic from said combined signal which is then combined into said single output signal;
   a first reverb control that receives said first undistorted signal and a musician input signal that defines the portion of said first undistorted signal independent of said portion of said second distorted signal; and
   a second reverb control that receives said second distorted signal and a musician input signal that defines the portion of said second distorted signal independent of said portion of said first undistorted signal.

9. The amplifier of claim 1, further comprising a power amp that receives said single output signal and amplifies said single output signal into an speaker driving output signal that can be received by an audio speaker to produce an audio signal.

10. An amplifier circuit receiving an input signal from an electric guitar for producing an output signal that includes both a clean amplified signal and a dirty amplified signal wherein said amplifier circuit comprises:
    a panning pedal that is continuously movable over a range of motion by manipulation of said pedal by said musician;
    one or more variable resistors attached to said panning pedal and receiving said input signal from said electric guitar, wherein said one or more variable resistors define a range of resistances that correspond to said range of motion of said panning pedal so that movement of said panning pedal varies said resistance of said one or more variable resistors and wherein said one or more variable resistors transform said input signal into a first and a second signal wherein the proportion of said first and said second signals is dependent upon the position of said panning pedal;
    a first pre-amp stage that receive said first signal from said one or more variable resistors and amplifies said first signal so that a substantially undistorted clean signal is produced; and
    a second pre-amp stage that receive said second signal from said one or more variable resistors and amplifies said second signal so that a second distorted dirty signal is produced, wherein said dirty signal occurs as a result of said second pre-amp stage being driven into saturation and wherein said clean signal and said dirty signal are then combined into a single output signal.

11. The amplifier of claim 10, wherein said first pre-amp stage is comprised of a single tube amplifier that amplifies said first signal into said clean signal.

12. The amplifier of claim 11, wherein said second pre-amp stage is comprised of a plurality of tube amplifiers that amplify said second signal so that said dirty signal is said saturated output signal.

13. The amplifier of claim 10, further comprising:
    a first tone control stage receiving said clean signal and having one or more musician inputs wherein said musician can adjust the tone characteristics of said clean signal independently of said tone characteristics of said dirty signal; and a second tone control stage receiving said dirty signal and having one or more musician inputs wherein said musician can adjust the tone characteristics of said dirty signal independently of said tone characteristics of said clean signal.

14. The amplifier of claim 10, further comprising:

a first volume control receiving said clean signal and one or more musician input signals which adjusts the amplitude of the clean signal independent of the volume of said dirty signal; and a second level control receiving said dirty signal and one or more musician input signals which adjusts the amplitude of said dirty signal independent of the amplitude of said clean signal.

15. The amplifier of claim 10, wherein said first and second pre-amp stages are configured so that said first signal and said second signal are in phase, said clean signal and said first signal are in phase and said second signal and said dirty signal are in phase.

16. The amplifier of claim 10, further comprising:

a reverb circuit that receives combined signal comprised of a portion of said clean signal and a portion of said dirty signal and produces a reverb characteristic from said combined signal which is then combined into said single output signal;

a first reverb control that receives said clean signal and a musician input signal that defines the portion of said clean signal independent of said portion of said dirty signal; and a second reverb control that receives said dirty signal and a musician input signal that defines the portion of said dirty signal independent of said portion of said clean signal.

17. The amplifier of claim 10, further comprising a power amp that receives said single output signal and amplifies said single output signal into an speaker driving output signal that can be received by an audio speaker to produce an audio signal.

18. A method of amplifying an output signal of an electric guitar comprising the steps of:

depressing a panning pedal while simultaneously playing the electric guitar so as to change the resistances of one or more variable resistors that receive said output signal of said electric guitar so as to define a first and a second signal from said output signal wherein the proportion of said first and said second signals is dependent upon the position of said panning pedal;

amplifying said first signal provided by said panning pedal to produce a clean amplified signal;

amplifying said second signal provided by said panning pedal to produce a dirty amplified signal wherein said dirty amplified signal is comprised of a saturated signal; and combining said clean signal and said dirty signal into a single output signal.

* * * * *